United States Patent [19]

Marchelli et al.

[11] 4,300,100
[45] Nov. 10, 1981

[54] CIRCUIT ARRANGEMENT FOR CORRELATING SEVERAL ISOFREQUENTIALLY STEPPED COUNTING CHAINS

[75] Inventors: Francesco Marchelli; Anes Sbuelz, both of Milan, Italy

[73] Assignee: Societa Italiana Telecomunicazioni Siemens S.p.A., Milan, Italy

[21] Appl. No.: 61,469

[22] Filed: Jul. 27, 1979

[30] Foreign Application Priority Data

Jul. 28, 1978 [IT]  Italy ........................... 26238 A/78

[51] Int. Cl.³ ............................................. H03K 23/00
[52] U.S. Cl. .................................... 328/109; 307/219; 307/220 R; 328/110; 328/179
[58] Field of Search ............... 328/105, 109, 110, 137, 328/139, 153, 179; 307/210, 219, 220 R, 232, 295

[56] References Cited

U.S. PATENT DOCUMENTS

| | | | |
|---|---|---|---|
| 3,518,555 | 6/1970 | Konotchick, Jr. | 328/109 X |
| 3,546,599 | 12/1970 | Konotchick, Jr. | 328/105 |
| 4,156,200 | 5/1979 | Gomez | 307/219 X |
| 4,213,064 | 7/1980 | Nagano | 307/219 X |

*Primary Examiner*—Eugene La Roche
*Attorney, Agent, or Firm*—Karl F. Ross

[57] ABSTRACT

A plurality of binary counters, each consisting of a primary and a secondary counting chain, are stepped by respective trains of clock pulses of like cadence but indeterminate phase relationship. The several primary counting chains are provided on their input sides with respective correlation circuits and on their output sides with respective sync generators, either of which is used for a concurrent restarting of both chains upon the attainment of a full count. A selection signal establishes one of the primary counting chains as the master by unblocking its sync generator while blocking its correlation circuit, the opposite being the case in all the other counters which are controlled from the unblocked sync generator through their respective correlation circuits. The primary and secondary chains of each counter work into a common comparator which detects any disparity in their readings and, in the event of such disparity, emits an alarm signal while also modifying the selection signal to designate a different primary chain as the master.

9 Claims, 9 Drawing Figures

CIRCUIT ARRANGEMENT FOR CORRELATING SEVERAL ISOFREQUENTIALLY STEPPED COUNTING CHAINS

FIELD OF THE INVENTION

My present invention relates to a circuit arrangement for correlating the operations of a plurality of multistage binary counters which are stepped substantially isofrequentially, i.e. by pulse trains of nearly or exactly identical cadence but indeterminate phase relationship.

BACKGROUND OF THE INVENTION

Multistage counters of the type here envisaged are used, e.g. in communication system, to generate various timing signals recurring at predetermined intervals. In such a system, equipment handling incoming bit streams from several remote locations must extract different trains of clock pulses, ideally having the same cadence or repetition frequency, from respective message frames. The random phase relationship between the extracted clock-pulse trains, driving respective pulse counters of like counting capacity, can be detrimental to the operation of the system unless these counters are periodically realigned to correlate the timing signals emitted by them. Such correlation or realignment is also necessary where a plurality of identical but mutually independent pulse counters are isofrequentially stepped by respective clocks, for the sake of redundancy, to guard against malfunction of a timing unit including such a counter.

Conventional means for ascertaining a malfunction of a given timing unit include the provision in such unit of a primary and a secondary counting chain of identical construction driven by a common source of stepping pulses, the two chains working into respective inputs of a comparator designed to detect a possible disparity in their counts and to emit an alarm signal in the event of such disparity. During normal operation, the chains are periodically reset by respective control circuits, in response to full-count signals from their final stage outputs, for a simultaneous restarting of their counts.

OBJECT OF THE INVENTION

The object of our present invention is to provide means for effectively correlating the operation of two or more multistage counters (each counter possibly including a primary and secondary chain of binary stages) which are driven substantially isofrequentially by separate sources of clock-pulse trains.

SUMMARY OF THE INVENTION

In a system according to my invention, in which timing signals are periodically emitted by a plurality of self-resetting multistage binary counters stepped by respective sources of trains of clock pulses of substantially identical cadence but indeterminate phase relationship as discussed above, each counter is associated with a respective correlation or alignment circuit connected to the corresponding pulse source with interposition of individual control means between each correlation circuit and a zero-setting input of the associated counter. Each counter is further associated with a respective synchronization circuit having a first input terminal connected to an output of the counter for receiving therefrom a full-count signal, a second input terminal connected to the corresponding pulse source, and output means connected to the control means of the associated counter and to the correlation circuit or circuits associated with the remaining counter or counters for delivering thereto a restarting signal in response to the full-count signal received from the associated counter.

The correlation circuit of one counter, chosen as the master, is selectively deactivated by inhibiting means simultaneously deactivating the synchronization circuit of every other counter, acting as a slave; each active correlation circuit (associated with a slave counter) is responsive to the presence of a restarting signal from the active synchronization circuit (associated with the master counter) for emitting to its own control circuit an internal command in predetermined time relationship with the received clock pulses, each control circuit being responsive to both the restarting signal and the internal command, as the case may be, for delivering an actuating pulse to the zero-setting input of the associated counter.

Advantageously, the clock pulses fed to each counter are also transmitted to a resetting input of the associated control circuit for terminating the generated actuating pulse after a fraction of a clock cycle, irrespectively of the duration of the full-count signal giving rise to the actuating pulse. This is particularly important in cases where the counter, in a manner known per se and as mentioned above, includes a primary and a secondary counting chain working into a common comparator since, if a malfunction of the master chain controlling the restarting of all the counters were to prolong the actuating pulse for an indefinite period, the primary and secondary chains of all counters would remain in their zero position and none of the comparators would detect a disparity giving rise to an alarm indication.

BRIEF DESCRIPTION OF THE DRAWING

The above and other features of my invention will now be described in detail with reference to the accompanying drawing in which.

SPECIFIC DESCRIPTION

Figure 1:
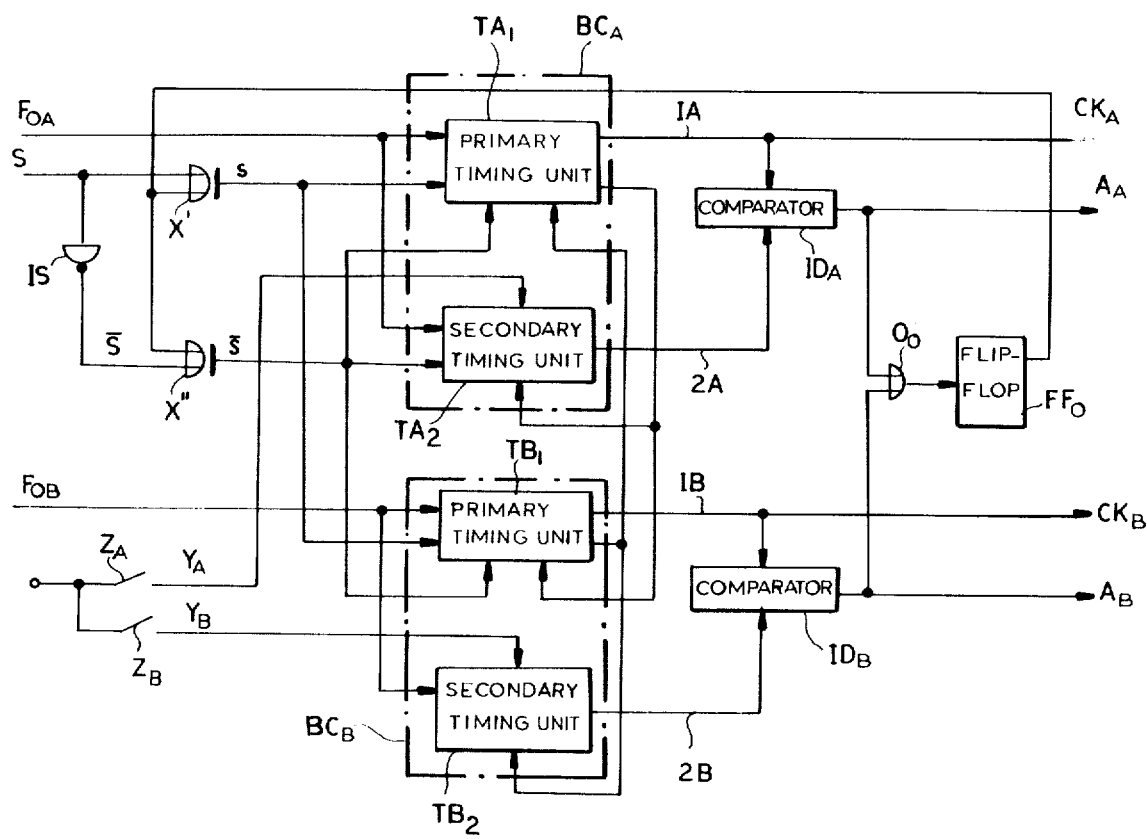
FIG. 1 is an overall block diagram of a circuit arrangement according to my invention comprising two independently stepped pulse counters of the dual-chain type.

In FIG. 1 I have shown two binary counters $BC_A$, $BC_B$ each comprising a pair of timing units driven by respective trains of clock pulses $F_{OA}$ and $F_{OB}$, i.e. a primary unit $TA_1$ paired with a secondary unit $TA_2$ and a primary unit TB paired with a secondary unit $TB_2$. Primary units $TA_1$ and $TB_1$ periodically emit respective timing pulses $CK_A$ and $CK_B$ to nonillustrated loads. These timing pulses appear on branch leads of respective output multiples 1A, 1B extending from each primary unit to one set of inputs of an associated comparator $ID_A$, $ID_B$ which also has another set of inputs connected to an output multiple 2A, 2B of the respective secondary unit $TA_2$, $TB_2$.

Comparator $ID_A$, in a manner well known per se, emits an alarm signal $A_A$ whenever the signal patterns on multiples 1A and 2A are not identical. Analogously, comparator $ID_B$ generates an alarm signal $A_B$ upon detecting a disparity between the signal patterns of multiples 1B and 2B.

A binary selection signal S determines which one of the two primary units is to act as a master controlling the periodic resetting and restarting of all four units. Signal S is fed directly to an Exclusive-OR gate X' and through an inverter IS, as a negated signal $\bar{S}$, to another XOR gate X". Gates X' and X" have other inputs connected to an output of a JK-type flip-flop $FF_o$ whose switching input receives alarm signals $A_A$ and $A_B$ by way of an OR gate $O_o$. As long as flip-flop $FF_o$ is not set, signals S and $\bar{S}$ are passed unchanged as signals s and $\bar{s}$ to inhibiting inputs of both primary units $TA_1$ and $TB_1$; when the flip-flop is set by an alarm signal, selection signals s and $\bar{s}$ are interchanged.

FIG. 1 also shows two switches $Z_A$, $Z_B$ which are manually closable to transmit a test signal $Y_A$, $Y_B$ to unit $TA_2$ or $TB_2$, respectively.

Figure 2:
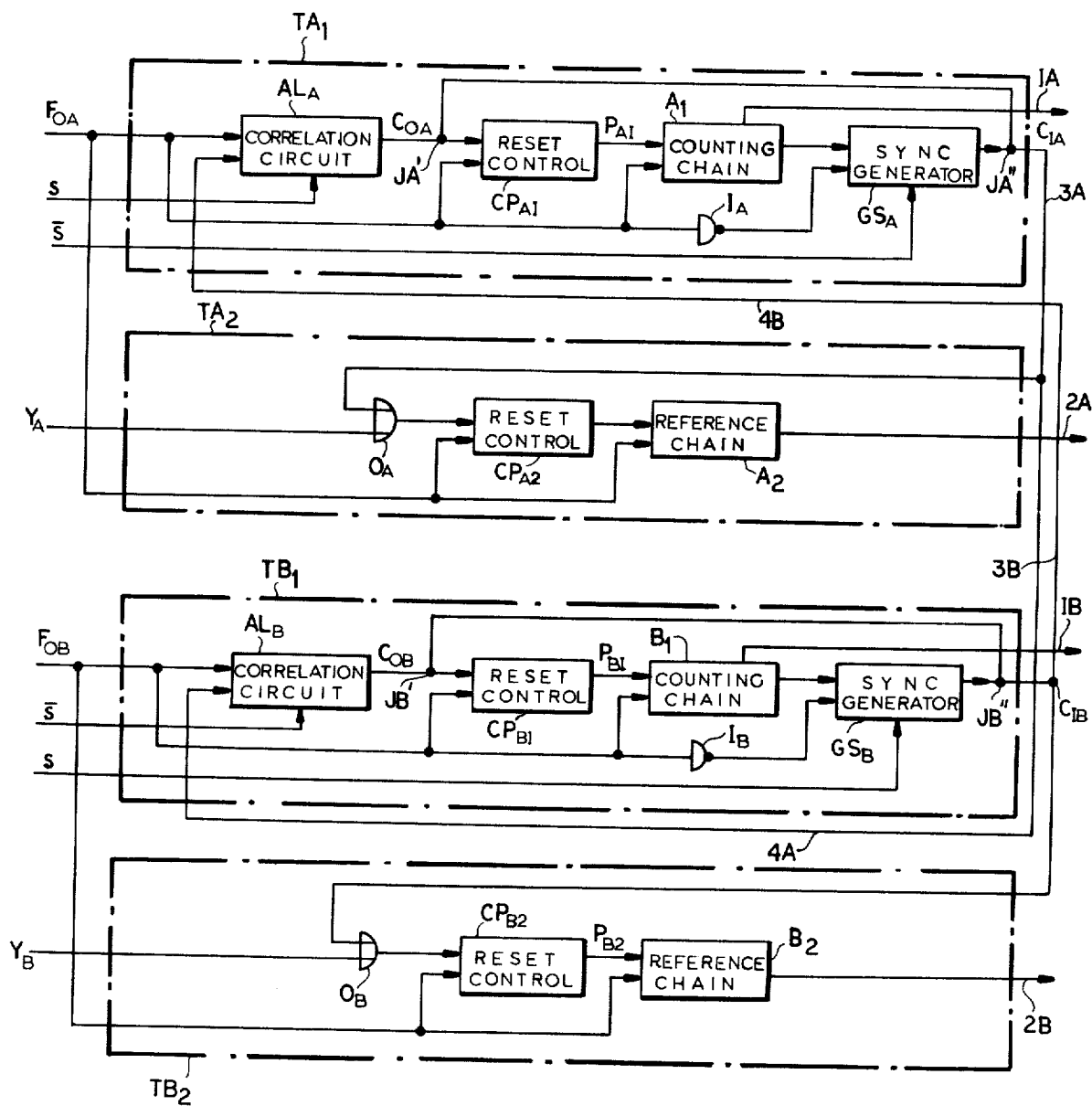
FIG. 2 is a more detailed block diagram of the two pairs of counting chains and associated components.

FIG. 2 shows details of timing units $TA_1$, $TA_2$, $TB_1$ and $TB_2$. Each primary unit comprises a binary counting chain $A_1$, $B_1$ with a zero-setting input connected to an associated reset-control circuit $CP_{A1}$, $CP_{B1}$, similar control circuits $CP_{A2}$ and $CP_{B2}$ being provided for reference chains $A_2$ and $B_2$ of the two secondary units. All four counting chains $A_1$, $A_2$, $B_1$ and $B_2$ have the same number of binary stages, with stage outputs respectively connected to multiples 1A, 2A, 1B and 2B; primary chains $A_1$ and $B_1$, upon reaching the limit of their counting capacity, emit respective full-count signals $R_A$, $r_B$ to associated synchronization circuits or sync generators $GS_A$, $GS_B$. Each primary unit, furthermore, includes a correlation circuit $AL_A$, $AL_B$ working into the associated control circuit $CP_{A1}$, $CP_{B1}$.

Selection signals s and $\bar{s}$ are fed to inhibiting inputs of correlation circuits $AL_A$, $AL_B$ and sync generators $GS_A$, $GS_B$ in such a way that one correlation circuit (here $AL_A$) and one sync generator (here $GS_B$) are cut off by the signal s whereas the other correlation circuit ($AL_B$) and the other sync generator ($GS_A$) are enabled by the signal $\bar{s}$. In the situation here assumed, therefore, counting chain $A_1$ of counter $BC_A$ (FIG. 1) operates as a master, making counter $BC_B$ the slave.

Clock pulses $F_{OA}$ are transmitted to respective inputs of correlation circuit $AL_A$, control circuits $CP_{A1}$, $CP_{A2}$ and counting chains $A_1$, $A_2$; they also are fed through an inverter $I_A$ to sync generator $GS_A$. Analogously, clock pulses $F_{OB}$ are sent directly to circuits $AL_B$, $CP_{B1}$, $CP_{B2}$, $B_1$, $B_2$ and via an inverter $I_B$ to sync generator $GS_B$.

Each correlation circuit $AL_A$ and $AL_B$, when active, transmits a respective internal command $C_{OA}$, $C_{OB}$ to the associated control circuit $CP_{A1}$, $CP_{B1}$. Via a junction JA', which may be considered a wired OR gate, a restarting signal $C_{1A}$ emitted on a lead 3A by sync generator $GS_A$ (when the latter is active) reaches the same input of control circuit $CP_{A1}$ that receives the command $C_{OA}$ in the activated condition of circuit $AL_A$. A similar junction JA" transmits the command $C_{OA}$ from the activated correlation circuit $AL_A$ to the output lead 3A of the then deactivated sync generator $GS_A$ which is connected via an OR gate $O_A$ to an input of control circuit $CP_{A2}$. In like manner, control circuit $CP_{B1}$ receives either the internal command $C_{OB}$ from circuit $AL_B$ or the restarting signal $C_{1B}$ from an output lead 3B of sync generator $GS_B$ via a junction JB', either of these signals being also transmitted by way of a junction JB", lead 3B and an OR gate $O_B$ to an input of control circuit $CP_{B2}$. The other inputs of OR gates $O_A$ and $O_B$ receive the test signal $y_A$ or $y_B$ upon closure of the respective switch $Z_A$, $Z_B$ shown in FIG. 1. Lead 3A has a branch 4A extending to another input of correlation circuit $AL_B$; similarly, a branch 4B of lead 3B is connected to another input of correlation circuit $AL_A$.

With circuits $AL_A$ and $GS_B$ inhibited by the signal s as described above, the isofrequential stepping of counter $BC_A$ by pulse train $F_{OA}$ and counter $BC_B$ by pulse train $F_{OB}$ generates the restarting signal $C_{1A}$ in the output of sync generator $GS_A$ as soon as the latter receives the full-count signal $r_A$ from chain $A_1$. Signal $C_{1A}$ reaches control circuits $CP_{A1}$ and $CP_{A2}$ via junction JA' and OR gate $O_A$, respectively, and is also fed via branch lead 4A to correlation circuit $AL_B$ which thereupon transmits the internal command $C_{OB}$ to control circuits $CP_{B1}$ and $CP_{B2}$; the simultaneous transmission of this command to correlation circuit $AL_A$ via branch lead 4B is ineffectual since that circuit is inhibited.

Restarting signals $C_{1A}$, $C_{1B}$ and internal commands $C_{OA}$, $C_{OB}$ are pulses of a duration equal to one clock cycle, as more fully discussed hereinafter. In response to them the four control circuits emit their respective actuating pulses $P_{A1}$, $P_{A2}$, $P_{B1}$, $P_{B2}$ which are terminated after not more than half a clock cycle by the arrival of a clock pulse $F_{OA}$ or $F_{OB}$. The actuating pulses set the respective counting chains to zero for immediate restarting in response to the arrival of further clock pulses. Since pulse trains $F_{OA}$ and $F_{OB}$ are generally not in phase with each other, pulses $P_{A1}$, $P_{A2}$ on the one hand and $P_{B1}$, $P_{B2}$ on the other hand may come into existence at different instants separated by less than a clock cycle.

If the main and reference chains $A_1$, $A_2$ or $B_1$, $B_2$ of either counter should fall out of step with each other, the corresponding comparator $ID_A$ or $ID_B$ (FIG. 1) emits its alarm signal $A_A$ or $A_B$ and at the same time, via OR gate $O_o$, switches the flip-flop $FF_o$ with resulting transposition of selection signals s and $\bar{s}$ whereby chain $B_1$ of counter $BC_B$ becomes the master and counter $BC_A$ is relegated to the role of slave. If such a reversal of roles cancels the alarm indication, the system may continue in this condition for an indefinite period, subject to another possible reversal in the event of a new malfunction. Naturally, a sustained or rapidly recurring alarm signal will call for remedial action.

Figure 3:
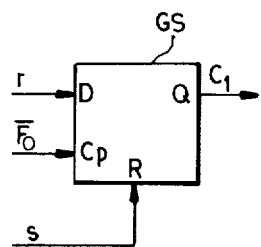
FIG. 3 shows details of a synchronization circuit associated with each of the counters of FIGS. 1 and 2.

In FIG. 3 I have generically illustrated a sync generator GS in the form of a data-type flip-flop whose data input D receives the full-count signal r from the associated counting chain and whose switching input $C_p$ responds to the leading edge of the incoming inverted clock pulses $F_O$. Flip-flop GS also has a resetting input R, receiving the selection signal s (or $\bar{s}$), and has a set output Q generating the corresponding restarting signal $C_1$.

Figure 3A:
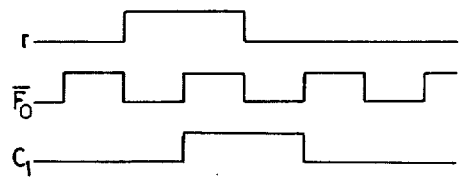
FIG. 3a is a set of graphs relating to the operation of the synchronization circuit shown in FIG. 3.

As illustrated in FIG. 3a, signal r has a leading edge coinciding with a trailing edge of an inverted clock pulse $\overline{F}_O$ and lasts for a full clock cycle. In the middle of that cycle, the appearance of the leading edge of the immediately following pulse $\overline{F}_O$ gives rise to the starting signal $C_1$ which also lasts for one clock cycle, being terminated by the leading edge of the next pulse $\overline{F}_O$ upon the disappearance of signal r.

Figure 4:
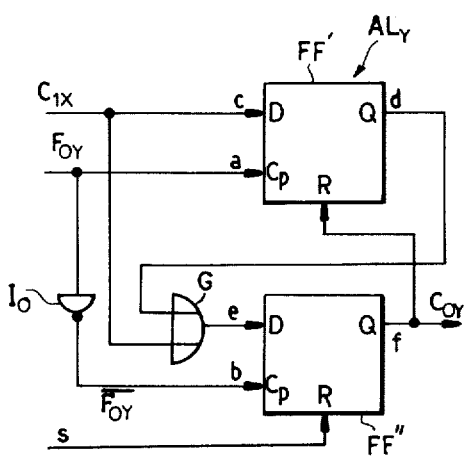
FIG. 4 shows details of a correlation circuit associated with each of the counters of FIGS. 1 and 2.

FIG. 4 shows a generic correlation circuit $AL_Y$, the letter Y standing for either one of the subscripts A,B in the diagram of FIG. 2. Circuit $AL_Y$ comprises two data-type flip-flops FF' and FF'' whose data inputs D receive the restarting signal $C_{IX}$ from the sync generator of the other counter (as denoted by the subscript X) and whose switching inputs $C_p$ are triggered by the associated clock pulses $F_{OY}$. These clock pulses are transmitted directly to flip-flop FF' over a lead a by way of an inverter $I_o$ and a lead b to flip-flop FF''. Signal $C_{IX}$ arrives at flip-flop FF' by way of a lead c and at flip-flop FF'' via an OR gate G and a lead e. The set output Q of flip-flop FF' is connected through a lead d and OR gate G to the input lead e of flip-flop FF'' whose set output Q emits the internal command $C_{OY}$ on a lead f. Command $C_{OY}$ is also fed to the resetting input R of flip-flop FF' whereas the corresponding input of flip-flop FF'' receives the selection signal s (or $\bar{s}$).

Figure 4A:
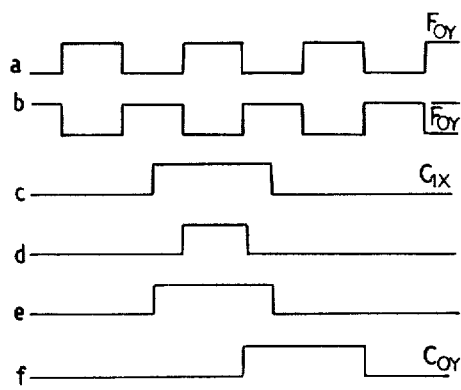
FIG. 4a is a set of graphs relating to the operation of the correlation circuit shown in FIG. 4.

The operation of circuit $AL_Y$ will now be explained with reference to FIG. 4a whose several graphs are labeled a–f in conformity with the corresponding leads of FIG. 4. The restarting signal $C_{IX}$ from the master chain, graph c, may arrive in any time position relative to the two mutually inverted pulse trains $F_{OY}$, $\overline{F}_{OY}$ shown in graphs a and b. In the illustrated example, the arrival of this signal (which also appears on lead e) occurs in the absence of a clock pulse $F_{OY}$ so that flip-flop FF' is set only a fraction of a cycle later upon the occurrence of the next clock pulse, thereby energizing the lead d; since, however, lead e already carries voltage, this energization is of no effect. With the disappearance of the clock pulse, the leading edge of an inverted pulse $F_{OY}$ sets the flip-flop FF'' to produce the command pulse $C_{OY}$ on lead f. Following the de-energization of lead e, the next pulse $F_{OY}$ transmits the command $C_{OY}$.

If the pulse $C_{IX}$ had arrived about half a clock cycle later than illustrated, command signal $C_{OY}$ would have been generated in the same time position by the leading edge of pulse $\overline{F}_{OY}$. The energization of lead f would then have prevented the setting of flip-flop FF'. The latter flip-flop is needed only to ensure that the command $C_{OY}$ is also generated if the arrival of pulse $C_{IX}$ coincides so closely with a leading edge of a pulse $\overline{F}_{OY}$ that flip-flop FF'' could fail to switch on either this or the next-following inverted clock pulse.

Figure 5:
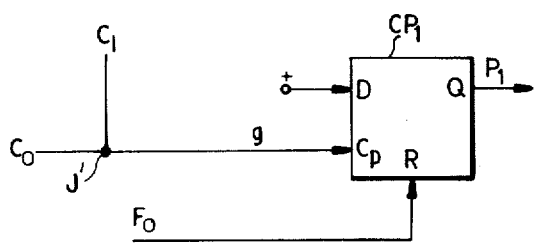
FIG. 5 shows details of a reset-control circuit associated with each primary counting chain of FIGS. 1 and 2.

Reference will now be made to FIG. 5 which shows a control circuit $CP_1$ (representative of either circuit $CP_{A1}$, $CP_{B1}$ in FIG. 2) constituted by another data-type flip-flop. This flip-flop has its data input D constantly energized from a point of fixed potential (+) and has its switching input $C_p$ tied by a lead g to a corresponding junction J' so as to receive either a restarting command $C_1$ from the associated sync generator or an internal command $C_O$ from the associated correlation circuit. Flip-flop $CP_1$ has its resetting input R connected to the source of clock pulses $F_O$ and generates on its set output Q the actuating pulse $P_1$.

Figure 5A:
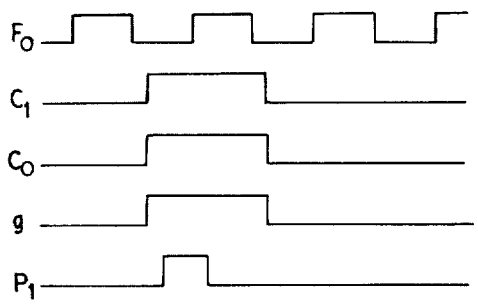
FIG. 5a is a set of graphs relating to the operation of the control circuit shown in FIG. 5.

Thus, as shown in FIG. 5a, the arrival of a pulse $C_1$ or $C_O$ generates on lead g a switching command of like duration which in practice lags slightly behind the trailing edge of a clock pulse $F_O$ and lasts for a full clock cycle. With data input D constantly energized, this switching signal gives rise—again with a certain lag—to the actuating pulse $P_1$ which is terminated after slightly less than half a clock cycle by the arrival of the leading edge of the next pulse $F_O$ at the resetting input R.

Figure 6:
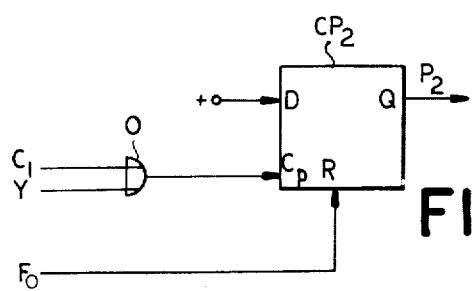
FIG. 6 shows details of a reset-control circuit associated with each secondary counting chain of FIGS. 1 and 2.

In FIG. 6 I have shown a control circuit $CP_2$, representative of circuits $CP_{A2}$ and $CP_{B2}$ of FIG. 2, which is a data-type flip-flop similar to that of FIG. 5 with the sole difference that its switching input $C_p$ receives either the restarting signal $C_1$ or the test signal y through the associated OR gate O. In the presence of this test signal, flip-flop $CP_2$ is continuously switched to emit a succession of actuating pulses $P_2$ which zeroize the associated counting chain $A_2$ or $B_2$ (FIG. 2) so as to create a disparity detected by the corresponding comparator $ID_A$ or $ID_B$ (FIG. 1). Upon the resulting switchover of the master role to the other counter, and after discontinuance of the test signal y, operation should return to normal as soon as the new master chain causes the restarting of both counters.

It will be apparent that the system here described may be extended to any number of counters working in substantial synchronism and that my invention is also applicable to counters comprising only one chain of binary stages.

I claim:

1. In a system for the periodic emission of a plurality of timing signals, including a plurality of self-resetting multistage binary counters with stepping inputs connected to respective sources of trains of clock pulses of substantially identical cadence but indeterminate phase relationship, each counter also having a zero-setting input, the combination therewith of:

a plurality of correlation circuits respectively associated with said binary counters and connected to the respective sources of clock pulses;

an individual control circuit inserted between each of said correlation circuits and a zero-setting input of the associated counter;

a plurality of synchronization circuits respectively associated with said binary counters, each of said synchronization circuits having a first input terminal connected to an output of the associated counter for receiving therefrom a full-count signal, a second input terminal connected to the respective source of clock pulses and output means connected to the control circuit of the associated counter and to the correlation circuit associated with every other of said counters for delivering a restarting signal thereto in response to said full-count signal; and inhibiting means for selectively deactivating the correlation circuit associated with one of said counters and the synchronization circuit associated with every other of said counters, each active correlation circuit being responsive to the presence of a restarting signal from the active synchronization circuit for emitting to the associated control circuit an internal command in predetermined time relationship with the received clock pulses, each control circuit being responsive to both said restarting signal and said internal command for delivering an actuating pulse to the zero-setting input of the associated counter.

2. The combination defined in claim 1 wherein each control circuit has a resetting input connected to receive the respective clock pulses fed to the associated counter for terminating said actuating pulse after a fraction of a clock cycle.

3. The combination defined in claim 2 wherein each control circuit comprises a flip-flop provided with said resetting input and further provided with a switching input connected to receive said restarting signal and said internal command.

4. The combination defined in claim 1 wherein said synchronization circuit comprises a flip-flop with a data input constituting said first terminal, a switching input constituting said second terminal and a resetting input connected to said inhibiting means.

5. The combination defined in claim 4 wherein said switching input is connected to said respective source of clock pulses through an inverter.

6. The combination defined in claim 1 wherein the correlation circuit associated with any one of said counters comprises a first and a second flip-flop, said first flip-flop having a data input connected to the output means of the synchronization circuit of each counter other than the associated counter, a switching input connected to the respective source of clock pulses, and a resetting input connected to an output of said second flip-flop, said second flip-flop having a data input additively connected to both the data input and an output of said first flip-flop, a switching input connected via an inverter to the respective source of clock pulses and a resetting input connected to said inhibiting means.

7. The combination defined in claim 1,2,3,4,5 or 6 wherein each of said counters comprises a primary counting chain and a secondary counting chain both connected to the associated control circuit and to the same source of clock pulses for zero-setting and stepping in unison, said primary counting chain emitting said full-count signal, further comprising a comparator for each counter with input connections to corresponding stage outputs of said primary and secondary counting chains for emitting an alarm signal upon detecting a disparity therebetween.

8. The combination defined in claim 7 wherein said comparator has an output connected to said inhibiting means for selectively activating previously deactivated correlation and synchronization circuits and deactivating previously active correlation and synchronization circuits in response to said disparity.

9. The combination defined in claim 8 wherein said secondary counting chain is provided with an ancillary input for receiving a blocking signal to test the associated comparator.

* * * * *